(12) United States Patent
Saeedi Vahdat et al.

(10) Patent No.: US 11,778,832 B2
(45) Date of Patent: Oct. 3, 2023

(54) WORDLINE CONTACT FORMATION IN NAND DEVICES

(71) Applicant: Applied Materials, Inc., Santa Clara, CA (US)

(72) Inventors: Armin Saeedi Vahdat, Burlington, MA (US); Tristan Y. Ma, Lexington, MA (US); Johannes M. van Meer, Middleton, MA (US); John Hautala, Beverly, MA (US); Naushad K. Variam, Marblehead, MA (US)

(73) Assignee: Applied Materials, Inc., Santa Clara, CA (US)

( * ) Notice: Subject to any disclaimer, the term of this patent is extended or adjusted under 35 U.S.C. 154(b) by 177 days.

(21) Appl. No.: 17/306,047

(22) Filed: May 3, 2021

(65) Prior Publication Data

US 2022/0352182 A1    Nov. 3, 2022

(51) Int. Cl.

| H10B 43/35 | (2023.01) |
| H10B 41/20 | (2023.01) |
| H10B 41/35 | (2023.01) |
| H10B 43/20 | (2023.01) |
| G11C 8/14 | (2006.01) |

(52) U.S. Cl.
CPC ............. *H10B 43/35* (2023.02); *G11C 8/14* (2013.01); *H10B 41/20* (2023.02); *H10B 41/35* (2023.02); *H10B 43/20* (2023.02)

(58) Field of Classification Search
CPC ........... H01L 27/1157; H01L 27/11524; H01L 27/11551; H01L 27/11578; G11C 8/14; G11C 16/08
See application file for complete search history.

(56) References Cited

U.S. PATENT DOCUMENTS

| 2017/0178911 A1* | 6/2017 | Ma ........................ H01L 21/308 |
| 2021/0193674 A1* | 6/2021 | Said ................... H01L 21/02172 |
| 2022/0285378 A1* | 9/2022 | Larsen ................ H01L 23/5386 |

* cited by examiner

*Primary Examiner* — Shahed Ahmed
*Assistant Examiner* — Khatib A Rahman
(74) *Attorney, Agent, or Firm* — KDW Firm PLLC

(57) ABSTRACT

Disclosed are approaches for 3D NAND structure fabrication. One method may include providing a stack of layers comprising a first and second plurality of layers, and forming a plurality of trenches in the stack of layers, wherein each of the trenches includes a tiered sidewall. A first trench may be formed to a first depth, and a second trench may be formed to a second depth, which is greater than the first depth. The method may further include forming a liner within the trenches, wherein the liner is deposited at a non-zero angle of inclination relative to a normal extending perpendicular from the top surface of the stack of layers. The liner may have a first thickness along the tiered sidewall of the first trench and a second thickness along the tiered sidewall of the second trench, wherein the first thickness is greater than the second thickness.

20 Claims, 4 Drawing Sheets

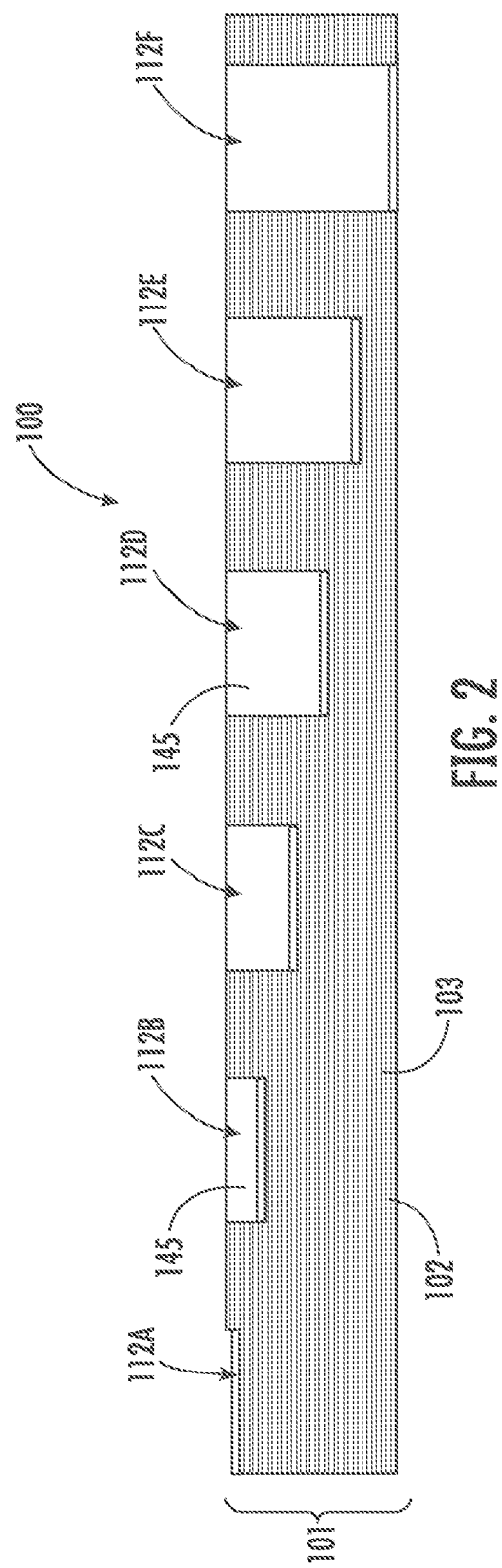

300

PROVIDING A STACK OF LAYERS ATOP A SUBSTRATE, THE STACK OF LAYERS COMPRISING A FIRST PLURALITY OF LAYERS AND A SECOND PLURALITY OF LAYERS
301

FORMING A PLURALITY OF TRENCHES IN THE STACK OF LAYERS, WHEREIN EACH OF THE PLURALITY OF TRENCHES INCLUDES A TIERED SIDEWALL, WHEREIN A FIRST TRENCH OF THE PLURALITY OF TRENCHES IS FORMED TO A FIRST DEPTH RELATIVE TO A TOP SURFACE OF THE STACK OF LAYERS, WHEREIN A SECOND TRENCH OF THE PLURALITY OF TRENCHES IS FORMED TO A SECOND DEPTH RELATIVE TO THE TOP SURFACE OF THE STACK OF LAYERS, AND WHEREIN THE SECOND DEPTH IS GREATER THAN THE FIRST DEPTH
302

FORMING A LINER WITHIN EACH OF THE PLURALITY OF TRENCHES, WHEREIN THE LINER IS DEPOSITED AT A NON-ZERO ANGLE OF INCLINATION RELATIVE TO A NORMAL EXTENDING PERPENDICULAR FROM THE TOP SURFACE OF THE STACK OF LAYERS, WHEREIN THE LINER HAS A FIRST THICKNESS ALONG THE TIERED SIDEWALL OF THE FIRST TRENCH, WHEREIN THE LINER HAS A SECOND THICKNESS ALONG THE TIERED SIDEWALL OF THE SECOND TRENCH, AND WHEREIN THE FIRST THICKNESS IS GREATER THAN THE SECOND THICKNESS
303

DEPOSITING A FILL MATERIAL WITHIN EACH OF THE PLURALITY OF TRENCHES
304

FORMING A WORDLINE CONTACT THROUGH THE FILL MATERIAL WITHIN EACH OF THE PLURALITY OF TRENCHES
305

FIG. 4

WORDLINE CONTACT FORMATION IN NAND DEVICES

FIELD

Embodiments of the present disclosure generally relate to substrate processing equipment and techniques, and more particularly, to methods and apparatus for three dimensional (3D) NAND structure fabrication.

BACKGROUND

To address challenges encountered in scaling planar (2D) NAND memory devices to achieve higher densities at a lower cost per bit, ultra-high density, three-dimensional (3D) stacked memory structures have been introduced. Such 3D memory structures are sometimes referred to as having a Bit Cost Scalable (BiCS) architecture, and include strings of vertically aligned memory cells. Typically, the vertically aligned memory cells are formed from an array of alternating conductor and insulator layers, where the conductive layers correspond to wordlines (WL) of the memory structure.

WL contact formation is typically done in a staircase module to establish electrical contact between string drivers and WL pages. As the number of WL tiers increases, the AR difference between shallow and deep staircase contacts increases significantly, which necessitates a two-step contact formation patterning process to avoid punch through defects in the shallow staircases. This more complex two-step patterning process increases cost and decreases throughput, especially for advanced nodes.

It is with respect to these and other considerations that the present disclosure is provided.

SUMMARY OF THE DISCLOSURE

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In view of the foregoing, a method may include providing a stack of layers atop a substrate, the stack of layers including a first plurality of layers and a second plurality of layers, and forming a plurality of trenches in the stack of layers. Each of the plurality of trenches may include a tiered sidewall, wherein a first trench of the plurality of trenches is formed to a first depth relative to a top surface of the stack of layers, wherein a second trench of the plurality of trenches is formed to a second depth relative to the top surface of the stack of layers, and wherein the second depth is greater than the first depth. The method may further include forming a liner within each of the plurality of trenches, wherein the liner is deposited at a non-zero angle of inclination relative to a normal extending perpendicular from the top surface of the stack of layers, wherein the liner has a first thickness along the tiered sidewall of the first trench, wherein the liner has a second thickness along the tiered sidewall of the second trench, and wherein the first thickness is greater than the second thickness.

In some approaches, a method of forming a three-dimensional NAND structure may include providing a stack of layers atop a substrate, the stack of layers comprising a plurality of wordlines separated by a plurality of insulating layers, and forming a plurality of trenches in the stack of layers. Each of the plurality of trenches may include a tiered sidewall, wherein a first trench of the plurality of trenches is formed to a first depth relative to a top surface of the stack of layers, wherein a second trench of the plurality of trenches is formed to a second depth relative to the top surface of the stack of layers, and wherein the second depth is greater than the first depth. The method may further include forming a liner within each of the plurality of trenches, wherein the liner is deposited at a non-zero angle of inclination relative to a normal extending perpendicular from the top surface of the stack of layers, wherein the liner has a first thickness along the tiered sidewall of the first trench, wherein the liner has a second thickness along the tiered sidewall of the second trench, and wherein the first thickness is greater than the second thickness.

In some approaches, a method of forming a three-dimensional NAND structure may include providing a stack of layers atop a substrate, the stack of layers comprising a plurality of alternating wordlines and dielectric layers, and forming a plurality of trenches in the stack of layers. Each of the plurality of trenches may include a tiered sidewall, wherein a first trench of the plurality of trenches is formed to a first depth relative to a top surface of the stack of layers, wherein a second trench of the plurality of trenches is formed to a second depth relative to the top surface of the stack of layers, and wherein the second depth is greater than the first depth. The method may further include forming a liner within each of the plurality of trenches, wherein the liner is deposited at a non-zero angle of inclination relative to a normal extending perpendicular from the top surface of the stack of layers, wherein the liner has a first thickness along the tiered sidewall of the first trench, wherein the liner has a second thickness along the tiered sidewall of the second trench, and wherein the first thickness is greater than the second thickness.

BRIEF DESCRIPTION OF THE DRAWINGS

By way of example, embodiments of the disclosure will now be described, with reference to the accompanying drawings, in which:

FIG. 2 depicts a side cross-sectional view of the exemplary structure including a fill material within the plurality of trenches, in accordance with embodiments of the present disclosure;

FIG. 4 is a process flow demonstrating a method in accordance with embodiments of the present disclosure.

Figure 1A:
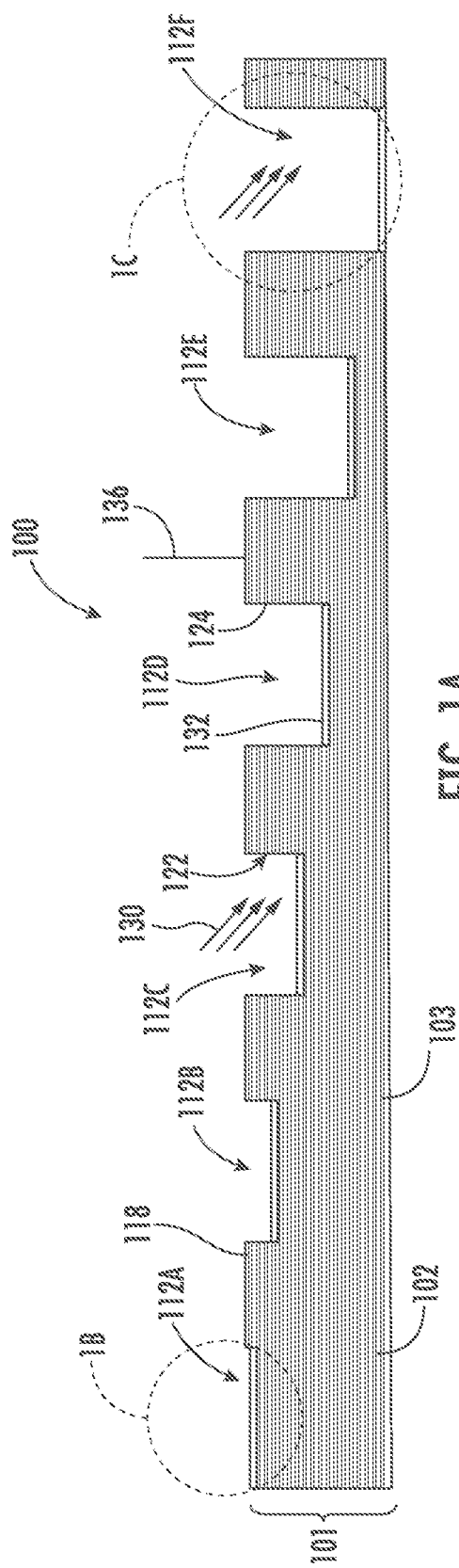
FIG. 1A depicts a side cross-sectional view of an exemplary structure including a plurality of trenches, in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity.

The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, devices, structures, and systems in accordance with the present disclosure will now be described more fully hereinafter with reference to the accompanying drawings, where embodiments are shown. The methods, devices, structures, and systems may be embodied in many different forms and are not to be construed as being limited to the embodiments set forth herein. Instead, these embodiments are provided so the disclosure will be thorough and complete, and will fully convey the scope of the methods, devices, structures, and systems to those skilled in the art.

Embodiments described herein generally relate to 3D NAND memory devices with improved wordline contact formation. Specifically, a plurality of trenches are formed through a stack of alternating layers of wordlines and insulation layers, wherein the depths of the plurality of trenches varies, and wherein each of the trenches includes a tiered or "staircase" sidewall along a lower portion thereof. An etch resistance liner is then formed within trenches of the devices using an angled deposition process. The liner may vary in thickness between the shallow trenches and the deeper trenches. Thicker etch resistant film formation along the shallow staircases advantageously balances the etch load and extends single patterning capabilities to future nodes.

Figure 1C:
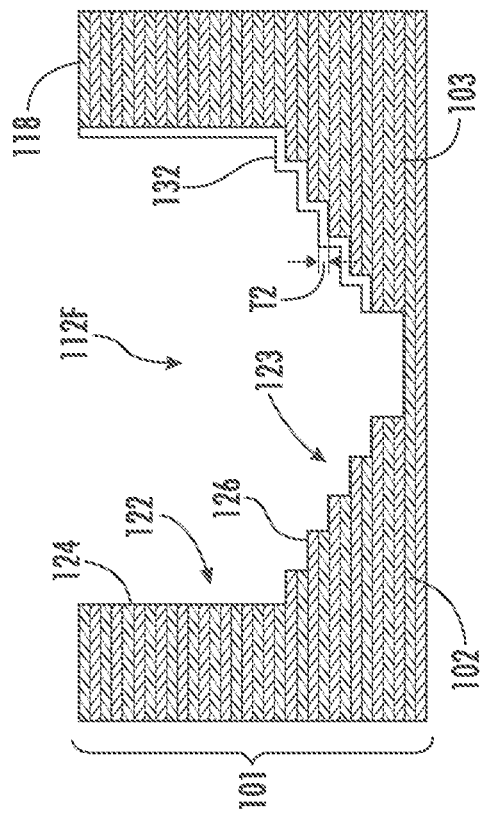
FIG. 1C is a close-up side cross-sectional view of another portion of the structure of FIG. 1A, in accordance with embodiments of the present disclosure.
Figure 1B:
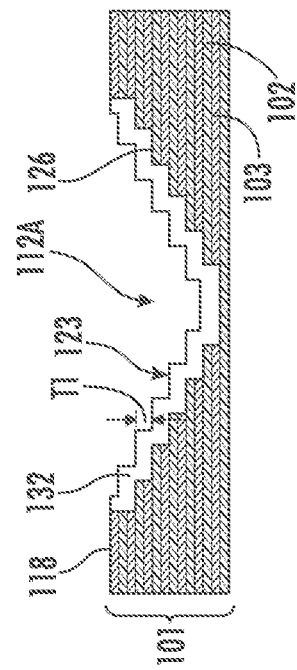
FIG. 1B is a close-up side cross-sectional view of a portion of the structure of FIG. 1A, in accordance with embodiments of the present disclosure.

FIGS. 1A-1C demonstrate a device or structure 100, such as a 3D NAND structure, according to embodiments of the disclosure. As shown, the structure 100 may include a stack of layers 101, such as first and second alternating layers 102, 103. In some examples, a layer thickness of either the first or second alternating layers 102, 103 may range between 5 nm and 500 nm. The embodiments are not limited in this context. In other embodiments, the stack of layers 101 may be composed of different sequences of layers, such as a sequence of three different layer types.

The stack of layers 101 may be formed atop a substrate (not shown), which can be any suitable starting material for forming integrated circuits, such as a silicon (Si) wafer or a germanium (Ge) wafer. The substrate may be a silicon semiconductor substrate having a layer or layers formed thereon, such as a film stack, employed to form a structure on the substrate 105. Although non-limiting, the substrate may include a material such as crystalline silicon (e.g., Si<100> or Si<111>), $Si_3N_4$, strained silicon, silicon germanium, doped or undoped poly-silicon (poly-Si), doped or undoped silicon, patterned or non-patterned wafer, silicon on insulator (SOI), carbon-doped silicon oxides, silicon nitride (SiN, $Si_3N_4$, etc.), doped silicon, germanium, gallium arsenide, glass, sapphire, metal layers disposed on silicon, and the like. The substrate may be a round wafer, such as a 200 mm, 300 mm, or 450 mm diameter wafer, or as a rectangular or square panel.

In some embodiments, the first layers 102 may be formed using any suitable conductive material (e.g., metal, metal nitride, or a conductive metal compound) such as W, molybdenum (Mo), tantalum (Ta), niobium (Nb), osmium (Os), zirconium (Zr), iridium (Jr), rhenium (Re), titanium (Ti), Ti nitride (N), TaN, WN, MoN, ZrN, $WO_x$, $RuO_x$, $IrO_x$, etc. The first layers 102 are provided to facilitate forming (or building) memory cell layers on the substrate. Each of the first layers 102 may correspond to a wordline of the structure 100, wherein each wordline may extend into the page to form additional memory cells that are not visible. The second layers 103 may be any suitable insulator, such as a dielectric. In various embodiments, the first and second and layers 102, 103 can be deposited on the substrate using any suitable deposition processes and/or apparatus, examples of which can include a chemical vapor deposition (CVD) apparatus, a physical vapor deposition (PVD) apparatus, or an atomic layer deposition (ALD) apparatus.

As shown, the structure 100 may include a plurality of trenches 112A-112F formed (e.g., etched) through the stack of layers 101. The trenches 112A-112F may include an upper section 122 and a lower section 123. In some embodiments, the upper section 122 may include a planar sidewall 124, while the lower section 123 may include a tiered or "staircase" sidewall 126, as best shown in FIGS. 1B, 1C. Although non-limiting, each individual tier of the tiered sidewall 126 may include a single first layer 102 and a single second layer 103. Any suitable etching apparatus and/or method may be employed to form the tiered sidewall 126, such as deep reactive-ion etching (DRIE), a highly anisotropic etch process employed to create high aspect-ratio holes and trenches in wafers or other substrates. Etching gases suitable for such etching processes can include fluoride ($SF_6$, $CF_4$, $CHF_4$, $CH_3F$, $C_2F_6$, $C_4F_8$, and $NF_3$), chloride (HCl, $Cl_2$, $BCl_3$), bromide ($Br_2$, HBr), or, an oxygen containing gas (e.g., $O_3$, $O_2$, $CO_2$, CO, $H_2O$, NO, $NO_2$, $N_2O$, CO, and the like) and optionally may include an inert gas, such as argon (Ar) or helium (He). Embodiments are not limited in this context.

As further shown, the trenches 112A-112F may extend to different depths relative to a top surface 118 of the stack of layers 101. For example, a first depth of trench 112A may be smaller/less than the depth of trenches 112B-112F. In the embodiment shown, the depth of trench 112F may be the greatest.

As further shown, a deposition process 130 may be performed to form a liner 132 within the trenches 112A-112F. The deposition process 130 may include delivering radicals (e.g., carbon or poly) to the 112A-112F at a non-zero angle of inclination relative to a vertical 136 extending from the top surface 118 of the stack of layers 101. In some embodiments, the liner 132 is an etch resistant layer, which is conformally deposited over desired surfaces of the structure 100. As shown, the liner 132 may extend along the planar sidewall 124 of one or more of the trenches, such as trench 112F. The tiered sidewalls 126 of trenches 112B-112F may be partially or fully covered by the liner 132. In exemplary embodiments, the liner 132 is formed with an AR-dependent thickness. For example, for the more shallow trench 112A, the liner 132 has a thickness 'T1', which is greater than a thickness 'T2' of the liner 132 in the deeper trench 112F.

In various embodiments, the angle of inclination of the deposition process 130 may vary so the liner 132 impacts more or less of the trenches 112A-112F. In some embodiments, the structure 100 may be rotated during or between successive deposits so all intended sides of the trenches 112A-112F are impacted. For example, the structure 100 may be rotated between each deposition process by 180° to deposit the liner 132 on opposite sides of the trenches. A combination of other angles such as 45° or 90° may be used. Still furthermore, the liner 132 may also be deposited in two directions simultaneously, wherein the deposited species reaches the trenches 112A-112F in both positive and negative angles with respect to the vertical 136.

Next, as shown in FIG. 2, a fill material 145 may be formed over the structure 100, including within each of the plurality of trenches 112A-112F, after formation of the liner 132. In some embodiments, the fill material 145 may be a dielectric, which is deposited and then planarized. Although non-limiting, the fill material 145 may be any suitable material including, but not limited to, TiN, W, SiN, oxide, or combinations thereof.

Although not shown, a contact may then be formed through the fill material 145 within each of the plurality of trenches 112A-112F. In some embodiments, one or more back end of the line (BEOL) processes can be performed to form the wordline contacts. For example, an etching apparatus can be configured to form openings through the fill material 145, which are then filled with the conductive material of the contacts. In some embodiments, a hard mask deposition process may first be performed prior to performing the etching, and a hard mask layer that is deposited prior to etching can be removed after etching is complete and the openings for the contacts are formed.

Figure 3:
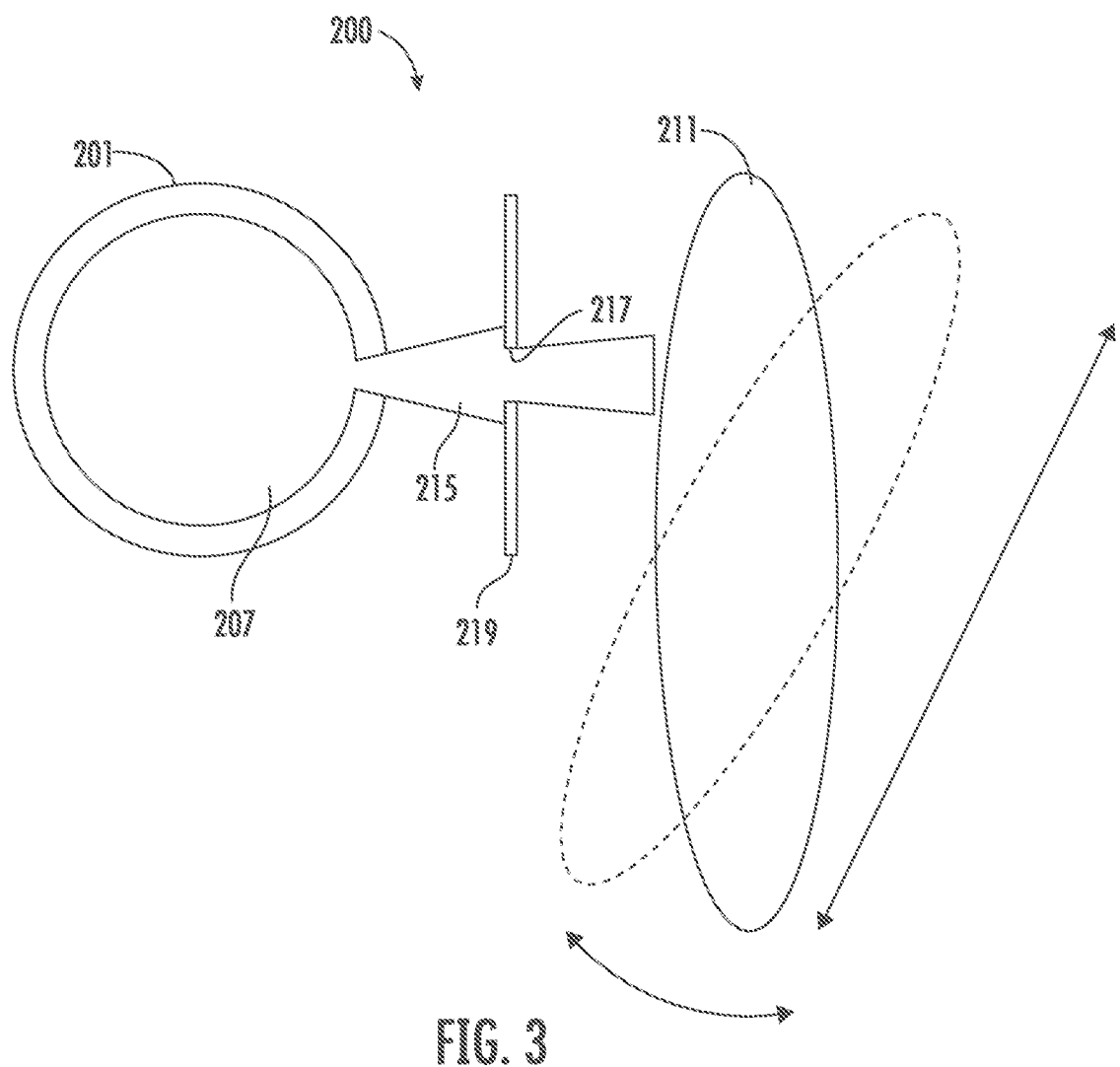
FIG. 3 is a schematic diagram of a system for forming a liner over the structure, in accordance with at least one embodiment of the present disclosure.

FIG. 3 illustrates a portion of a system 200 useful to perform processes described herein. In one embodiment, the system 200 may include a plasma source 201, such as an RF plasma source, for generating a plasma 207, which is directed towards a platen or wafer 211 as a ribbon beam 215. In some embodiments, the environment of wafer 211 may be between room temperature and 450 C, and at a low pressure, e.g., 10-6 to 10-2 Torr, to enable long mean-free-paths of plasma generated radicals. In some embodiments, the ribbon beam 215 is a PECVD ribbon beam delivered through one or more apertures 217 of a beam blocker 219. In some embodiments, the aperture(s) 217 may include one or more cross members used to control reactive species in dimensions along the ribbon beam 215. Although non-limiting, the ribbon beam 215 in some embodiments may be 300 mm in length and 5-25 mm in height, wherein the wafer 211 is biased at 0 to −1 kV relative to the plasma source 201. Potential gas species may include PECVD gasses, such as SiH4, CH4, NH3, O2, N2, SiCl4, GeH4, Ar, WF6, etc.

The plasma source 201 may provide a deposition process, such as the deposition process 130 demonstrated in FIG. 1A for forming the liner 132 as a film within the trenches 112A-112F of the structure 100. The wafer 211 may support the structure 100 to be processed. The wafer 211 may be moved in one or more dimensions (e.g. translate, rotate, tilt, etc.) by a component sometimes referred to as a "roplat" (not shown). Rotation of the plasma source 201 relative to the wafer 211 may be performed with the wafer 211 scanning in one dimension. In some embodiments, the system 200 may be an iso-centric scanning system to tilt the wafer 211 to a desired angle while maintaining a constant distance to the plasma source 201.

In some embodiments, the system 200 can be controlled by a processor-based system controller such as a controller (not shown). For example, the controller may be configured to control beam-line components and processing parameters associated with beam-line plasma implantation processes. The controller may include a programmable central processing unit (CPU) that is operable with a memory and a mass storage device, an input control unit, and a display unit, such as power supplies, clocks, cache, input/output (I/O) circuits, and the like, coupled to the various components of the system 200 to facilitate control of the substrate processing. The controller also includes hardware for monitoring substrate processing through sensors in the system 200, including sensors monitoring the substrate position and sensors configured to receive feedback from and control a heating apparatus coupled to the system 200. Other sensors that measure system parameters such as substrate temperature and the like, may also provide information to the controller.

To facilitate control of the system 200 described above, the CPU may be one of any form of general-purpose computer processor that can be used in an industrial setting, such as a programmable logic controller (PLC), for controlling various chambers and sub-processors. The memory is coupled to the CPU and the memory is non-transitory and may be one or more of readily available memory such as random access memory (RAM), read only memory (ROM), floppy disk drive, hard disk, or any other form of digital storage, local or remote. Support circuits may be coupled to the CPU for supporting the processor in a conventional manner. Implantation and other processes are generally stored in the memory, typically as a software routine. The software routine may also be stored and/or executed by a second CPU (not shown) that is remotely located from the hardware being controlled by the CPU.

Turning now to FIG. 4, a process 300 according to embodiments of the present disclosure is shown. At block 301, the process 300 may include providing a stack of layers atop a substrate, the stack of layers comprising a first plurality of layers and a second plurality of layers. In some embodiments, the first plurality of layers are wordlines and the second plurality of layers are insulators.

At block 302, the process 300 may include forming a plurality of trenches in the stack of layers, wherein each of the plurality of trenches includes a tiered sidewall, wherein a first trench of the plurality of trenches is formed to a first depth relative to a top surface of the stack of layers, wherein a second trench of the plurality of trenches is formed to a second depth relative to the top surface of the stack of layers, and wherein the second depth is greater than the first depth. In some embodiments, one of more of the plurality of trenches may include a substantially planar sidewall extending above the tiered sidewall(s).

At block 303, the process 300 may include forming a liner within each of the plurality of trenches, wherein the liner is deposited at a non-zero angle of inclination relative to a normal extending perpendicular from the top surface of the stack of layers, wherein the liner has a first thickness along the tiered sidewall of the first trench, wherein the liner has a second thickness along the tiered sidewall of the second trench, and wherein the first thickness is greater than the second thickness. In some embodiments, the liner is formed along the planar sidewall of the second trench. In some embodiments, the liner is a plasma film formed over the stack of layers by delivering radicals to the stack of layers at the non-zero angle of inclination.

At block 304, the process 300 may optionally include depositing a fill material within each of the plurality of trenches. At block 305, the process may optionally include forming a wordline contact through the fill material within each of the plurality of trenches.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the layers of the structure 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
providing a stack of layers comprising a first plurality of layers and a second plurality of layers;
forming a plurality of trenches in the stack of layers, wherein each of the plurality of trenches includes a tiered sidewall and a bottom surface, wherein a first trench of the plurality of trenches is formed to a first depth relative to a top surface of the stack of layers, wherein a second trench of the plurality of trenches is formed to a second depth relative to the top surface of the stack of layers, and wherein the second depth is greater than the first depth; and
forming a liner within each of the plurality of trenches, wherein the liner is deposited at a non-zero angle of inclination relative to a normal extending perpendicular from the top surface of the stack of layers, wherein the liner has a first thickness along the tiered sidewall of the first trench, wherein the liner has a second thickness along the tiered sidewall of the second trench, wherein the first thickness is greater than the second thickness, and wherein the liner is formed atop the bottom surface of the first trench without being formed atop the bottom surface of the second trench.

2. The method of claim 1, wherein forming the plurality of trenches in the stack of layers comprises forming a planar sidewall above the tiered sidewall of the second trench.

3. The method of claim 2, further comprising forming the liner along the planar sidewall of the second trench.

4. The method of claim 1, wherein forming the liner over the stack of layers comprises delivering radicals to the stack of layers at the non-zero angle of inclination.

5. The method of claim 1, further comprising depositing a fill material within each of the plurality of trenches after formation of the liner.

6. The method of claim 5, further comprising forming a contact through the fill material within each of the plurality of trenches.

7. The method of claim 5, wherein the fill material is a dielectric material.

8. The method of claim 1, wherein each layer of the first plurality of layers is a wordline, and wherein each layer of the second plurality of layers is a dielectric.

9. The method of claim 1, wherein the first thickness is measured vertically from a first horizontal surface of the tiered sidewall of the first trench, and wherein the second thickness is measured vertically from a second horizontal surface of the tiered sidewall of the second trench.

10. A method of forming a three-dimensional NAND structure, the method comprising:
  providing a stack of layers comprising a plurality of wordlines separated by a plurality of insulating layers;
  forming a plurality of trenches in the stack of layers, wherein each of the plurality of trenches includes a tiered sidewall and a bottom surface, wherein a first trench of the plurality of trenches is formed to a first depth relative to a top surface of the stack of layers, wherein a second trench of the plurality of trenches is formed to a second depth relative to the top surface of the stack of layers, and wherein the second depth is greater than the first depth; and
  forming a liner within each of the plurality of trenches, wherein the liner is deposited at a non-zero angle of inclination relative to a normal extending perpendicular from the top surface of the stack of layers, wherein the liner has a first thickness along the tiered sidewall of the first trench, wherein the liner has a second thickness along the tiered sidewall of the second trench, wherein the first thickness is greater than the second thickness, and wherein the liner is formed atop the bottom surface of the first trench without being formed atop the bottom surface of the second trench.

11. The method of claim 10, wherein forming the plurality of trenches in the stack of layers comprises forming a planar sidewall above the tiered sidewall of the second trench, and wherein the liner is formed along the planar sidewall of the second trench.

12. The method of claim 10, wherein forming the liner within each of the plurality of trenches comprises delivering radicals to the stack of layers at the non-zero angle of inclination.

13. The method of claim 10, further comprising:
  depositing a fill material within each of the plurality of trenches after formation of the liner; and
  planarizing the fill material.

14. The method of claim 13, further comprising forming a contact through the fill material within each of the plurality of trenches.

15. The method of claim 13, wherein the fill material is a dielectric material.

16. A method of forming a three-dimensional NAND structure, the method comprising:
  providing a stack of layers comprising a plurality of alternating wordlines and dielectric layers;
  forming a plurality of trenches in the stack of layers, wherein each of the plurality of trenches includes a tiered sidewall and a bottom surface, wherein a first trench of the plurality of trenches is formed to a first depth relative to a top surface of the stack of layers, wherein a second trench of the plurality of trenches is formed to a second depth relative to the top surface of the stack of layers, and wherein the second depth is greater than the first depth; and
  forming a liner within each of the plurality of trenches, wherein the liner is deposited at a non-zero angle of inclination relative to a normal extending perpendicular from the top surface of the stack of layers, wherein the liner has a first thickness along the tiered sidewall of the first trench, wherein the liner has a second thickness along the tiered sidewall of the second trench, wherein the first thickness is greater than the second thickness, and wherein the liner is formed atop the bottom surface of the first trench without being formed atop the bottom surface of the second trench.

17. The method of claim 16, wherein forming the plurality of trenches in the stack of layers comprises forming a planar sidewall above the tiered sidewall of the second trench, and wherein the liner is formed along the planar sidewall of the second trench.

18. The method of claim 16, wherein forming the liner within each of the plurality of trenches comprises delivering radicals to the stack of layers at the non-zero angle of inclination.

19. The method of claim 16, further comprising:
  depositing a fill material within each of the plurality of trenches after formation of the liner, wherein the fill material is a dielectric material; and
  planarizing the fill material.

20. The method of claim 19, further comprising forming a contact through the fill material within each of the plurality of trenches.

* * * * *